United States Patent [19]

Matsuda et al.

[11] Patent Number: 4,717,947
[45] Date of Patent: Jan. 5, 1988

[54] SEMICONDUCTOR DEVICE TURNED ON AND OFF BY LIGHT

[75] Inventors: Hideo Matsuda, Yokohama; Yoshiaki Tsunoda, Kawasaki; Takashi Fujiwara, Yokohama; Yasunori Usui, Kawasaki, all of Japan

[73] Assignee: Kabushiki Kaisha Toshiba, Kawasaki, Japan

[21] Appl. No.: 675,150

[22] Filed: Nov. 27, 1984

[30] Foreign Application Priority Data

Nov. 28, 1983 [JP] Japan .................. 58-223578

[51] Int. Cl.[4] .................. H01L 29/74; H01L 27/02; H01L 29/78; H01L 27/14
[52] U.S. Cl. .................. 357/38; 357/43; 357/23.14; 357/30; 357/23.12; 357/86
[58] Field of Search .................. 357/38.6, 43, 23, 30, 357/213.14, 86, 23.12

[56] References Cited

U.S. PATENT DOCUMENTS

| 3,590,339 | 6/1971 | Bilo | 357/38 |
|---|---|---|---|
| 3,789,504 | 2/1974 | Jaddam | 357/23.12 |
| 3,893,153 | 7/1975 | Page et al. | 357/38 |
| 4,050,083 | 9/1977 | Jaskolski et al. | 357/38 |
| 4,224,634 | 9/1980 | Svedberg | 357/43 |
| 4,295,058 | 10/1981 | Lade et al. | 357/38 |
| 4,604,638 | 8/1986 | Matsuda | 357/38 |

FOREIGN PATENT DOCUMENTS 0065173 11/1982 European Pat. Off. .
0064718 11/1982 European Pat. Off. .
2825794 12/1979 Fed. Rep. of Germany ...... 357/386

OTHER PUBLICATIONS

1984 National Meeting of Denki-Gakkai, A Collection of Lectures, Sec. 7, "Power Semiconductor Element for Self-Extinction and its Application" S7-13 through S7-16 (SI Thyristor) N. Tamamushi (Transliterated) et al.
J. Nishizawa et al., "Totally Light Controlled Static Induction Thyristor," ESS DERC, Sep. 10-13, 1984.
J. Nishizawa et al., "Totally Light Controlled Thyristor-Optically Triggerable and Optically Quenchable Static Induction Photo-Thyristor," Conference on Solid-State Devices and Materials, Kobe, Aug. 30-Sep. 1, 1984.

Primary Examiner—Martin H. Edlow
Assistant Examiner—Robert P. Limanek
Attorney, Agent, or Firm—Finnegan, Henderson Farabow, Garrett & Dunner

[57] ABSTRACT

A semiconductor device has a main GTO thyristor section, an auxiliary GTO thyristor section and a MOS transistor section. The main GTO thyristor section is turned on and off in accordance with a gate signal supplied to its gate terminal. The auxiliary GTO thyristor section supplies an igniting signal to the gate of the main GTO thyristor in accordance with an optical signal. The MOS transistor supplies an extinguishing signal to the gate of the main GTO thyristor section in accordance with an optical signal supplied to it.

11 Claims, 10 Drawing Figures

SEMICONDUCTOR DEVICE TURNED ON AND OFF BY LIGHT

Background of the Invention

The present invention relates to a semiconductor device such as a gate turnoff (GTO) device or a phototransistor which is turned on and off by incident light.

Various apparatus with thyristors are widely used. In each of these apparatuses, to turn off each thyristor, a forced commutation circuit, for example, must be used to apply a reverse bias between the anode and cathode of the thyristor. On the other hand, to turn on the thyristor it is necessary to supply an igniting pulse to the gate of the thyristor.

A GTO thyristor is turned on or off, depending on the polarity of the gate pulse supplied to the gate terminal. With any device with a GTO thyristor, it is difficult to electrically separate the main circuit from the control circuit. The design allowance of the control circuit is limited. Further, the control circuit is so complex that the device as a whole is large and heavy. To make matters worse, noise may be introduced somewhere within the control circuit and may erroneously actuate the elements of this circuit. Thus, the control circuit needs a protection circuit to prevent such an erroneous actuation.

To electrically separate the main circuit from the control circuit, a photocoupler may be used. The use of a photocoupler will inevitably make the device more complex.

A device with a thyristor which is turned on by an optical signal is known. It needs a forced commutation circuit for applying a reverse bias between the anode and cathode of the thyristor to turn off the thyristor. This is because the thyristor must be turned off electrically. The same problems will therefore arise in the thyristor of the ordinary type.

SUMMARY OF THE INVENTION

The object of this invention is to provide a semiconductor device which can be turned on and off by optical signals, which is small, light, reliable, and inexpensive and which has a control circuit which can be freely designed.

According to the present invention, there is provided a semiconductor device which can be turned on and off by optical signals. The device comprises a main GTO thyristor with a P emitter, an N base, a P base and an N+ emitter. It further has an N+ region which functions as a base. The device further includes a MOS transistor whose source region and drain region are the N+ region and the N+ emitter, respectively. The MOS transistor and a DC bias source are connected in series between the gate and cathode of the main GTO thyristor. Photodiodes are coupled in series between the gate of the MOS transistor and the gate of the main GTO thyristor. Thus the semiconductor device is turned on and off by optical signals supplied to it.

The semiconductor device of the invention is small, light, reliable, and inexpensive. Moreover, its control circuit can be freely designed.

DETAILED DESCRIPTION OF THE PREFERRED EMBODIMENTS

A few embodiments of the invention, i.e., GTO thyristors, will be described in detail with reference to the accompanying drawings.

Figure 1:
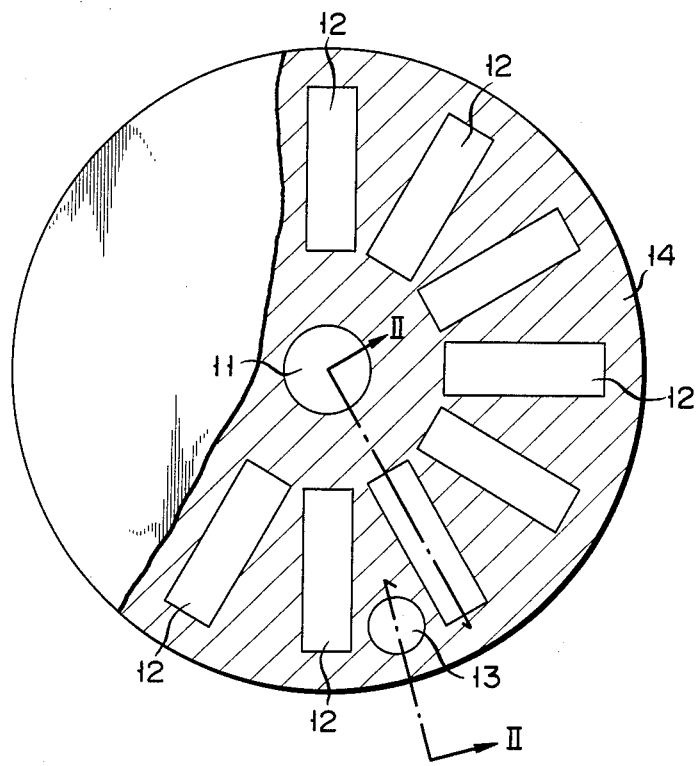
FIG. 1 is a plan view of a GTO thyristor, i.e., one embodiment of the present invention.

FIG. 1 is a plan view of a GTO thyristor device. This thyristor is shaped like a disc. The light-receiving section 11 of the auxiliary GTO thryistor is provided in the center portion of the GTO thyristor device. The main GTO thyristors 12 are arranged around the section 11 and radially extend. A photodiode section 13 comprising a plurality of photodiodes is provided in the peripheral portion of the GTO thyristor device. A thin aluminum electrode 14, which is the hatched area in FIG. 1, is formed on the upper surface of the thyristor device.

Figure 2:
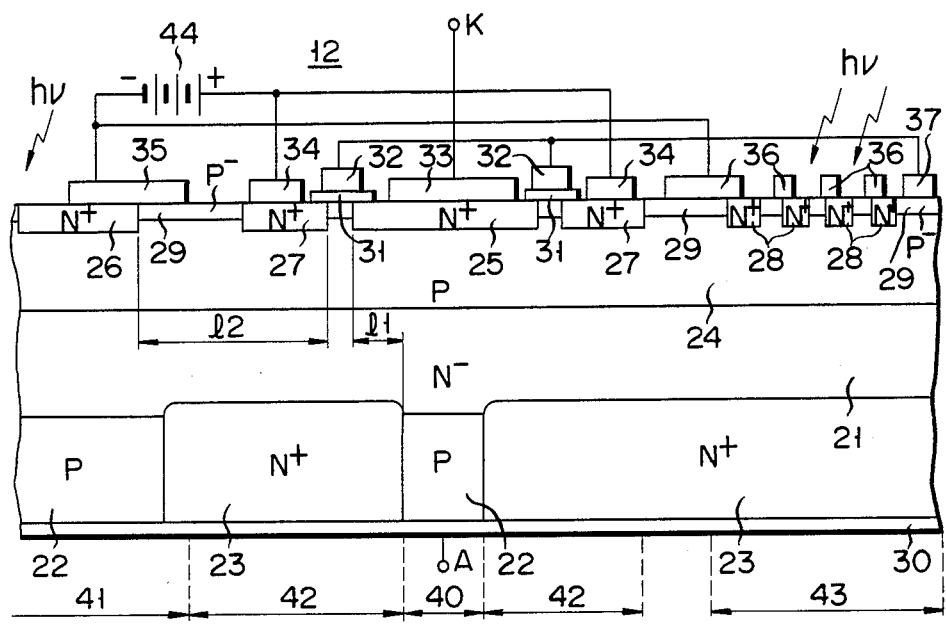
FIG. 2 is a cross-sectional view of the GTO thyristor shown in FIG. 1, taken along line II—II.
Figure 3:
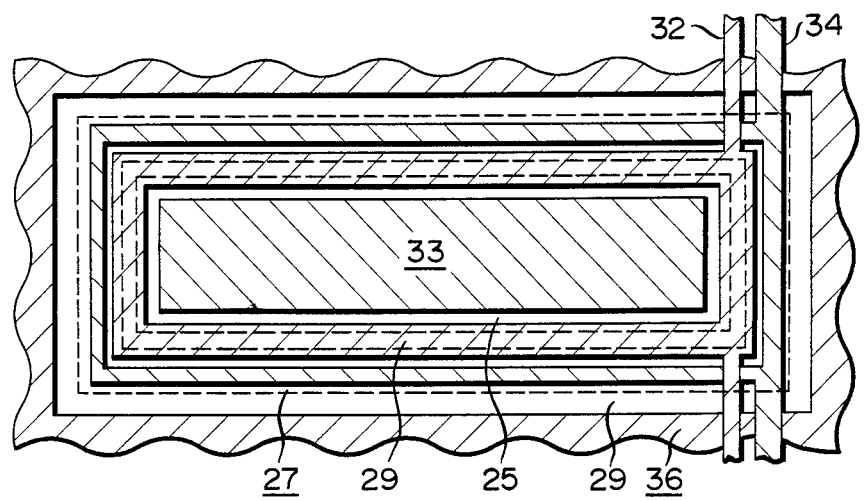
FIGS. 3 and 4 are enlarged plan views of the parts of the GTO thyristor.

As shown in FIG. 2, each main GTO thyristor 12 has an N− type region 21. This region 21 has a relatively low impurity concentration of about $3 \times 10^{13}$ cm$^{-3}$ and a relatively high resistivity of about 150 Ω·cm. P type regions 22 are formed in one of the exposed surfaces of the N− type region 21, separated from one another in the horizontal direction. The regions 22 have an impurity concentration of about $1 \times 10^{18}$ to $5 \times 10^{19}$ cm$^{-3}$ and a comparatively low resistivity. An N+ type region 23 is formed in said exposed surface of the N− region 21 and separates the P type regions 22. In the other exposed surface of the N− type region 21, a P type region 24 is formed. This region 24 has an impurity concentration of about $1 \times 10^{17}$ to $5 \times 10^{18}$ cm$^{-3}$ and a relatively low resistivity. An N+ type region 25 is formed in that portion of the exposed surface region of the P type region 24 which is positioned above the P type region 22 formed in the center portion of the N− type region 21. This region 25 has an impurity concentration of $1 \times 10^{20}$ to $1 \times 10^{21}$ cm$^{-3}$ and a comparatively low resistivity. An N+ type region 26 is formed in that portion of the surface region of the region 24 which is located above the left P type region 22, as viewed to the left of the drawing. An N+ type region 27 is formed in those portions of the surface region of the region 24 which are located above the N+ regions 23. The region 27 surrounds the N+ region 25 as shown in FIG. 3. N+ regions 28 are formed in that portion of the surface region of the region 24 which is located above the N+ type region 23. The N+ regions 26, 27 and 28 have an impurity concentration similar to that of the N+ type region 25.

The N type regions 25, 26, 27 and 28 are formed at the same time by diffusing an impurity into the P type region 24. P-regions 29 are formed in the portions of the N+ type region 24, other than those in which the N+ type regions 25, 26, 27 and 28 are formed.

The horizontal distance $l_1$ between the N+ type region 25 and the left end of the right P type region 22 is set to satisfy the following expression, where Lp is the diffusion length of holes:

$$l_1 \geq Lp/3 \quad (1).$$

The horizontal distance $l_2$ between the right end of the N+ type region 26 and the leftmost inner side of the N+ type region 27 is set to satisfy the following expression:

$$l_2 \geq Lp/3 \quad (2).$$

As shown in FIG. 2, an aluminum electrode 30 covers the exposed surfaces of the P type regions 22 and N+ type region 23. A gate insulation film 31 is formed on the exposed surface of the P type region 24 contacting the N+ type region 25 and the N+ type region 27. An aluminum electrode 32 is formed on this film 31. Aluminum electrodes 33 and 34 are formed on the exposed surfaces of the N+ type regions 25 and 27. An aluminum electrode 35 is formed on the exposed surface of the N+ type region 26 and on that portion of the P− type region 29 which is adjacent to the N+ type region 26. Aluminum electrodes 36 are formed, each partly on the N+ type regions 28 and partly on the P− type region 29 adjacent to the regions 28. Another aluminum electrode 37 is formed on the P− type region 29 which is positioned on the right-most electrode 36.

The P type region 22, N− type region 21, P type region 24 and N+ type region 25 form the thyristor section 40 on the main GTO thyristor 12. The regions 22, 21, 24 and 25 function as the P emitter, N base, P base and N+ emitter of the section 40, respectively. The electrode 30 is used as the anode, and the electrode 33 is used as the cathode. The electrodes 35 and 36 are connected, forming a gate electrode.

The P type region 22, N− type region 21, P type region 24 and N+ type region 26 form an auxiliary GTO thyristor section 41. These regions 22, 21, 24 and 26 function as an emitter, an N base, a P base and an N+ emitter, respectively. The electrode 30 is used as the anode of this auxiliary GTO thyristor section 41, and the electrode 35 is used for short-circuiting the emitter and gate of this section 41.

The N+ type regions 25 and 27, the electrode 32 and the electrode 33 form a N-channel MOS transistor section 42. The regions 25 and 27 are used as the source and drain of the section 42. The electrodes 32 and 33 function as the source and drain electrodes of the section 42. The P type region 24 and the N+ type regions 28 form photodiodes of a photodiode section 43. The photodiodes are coupled in series by the electrode 36. The left-most electrode 36 shown in FIG. 2 serves as a cathode common to the photodiodes, and the electrode 37 serves as an anode common to these photodiodes.

The electrode 32 which is used as the gate of the MOS transistor section 42 is connected to the electrode 37 which serves as the anode of the photodiode section 43. The electrode 35 for short-circuiting the emitter and gate of the auxiliary GTO thyristor section 41 is coupled to the electrode 36 which is the common cathode of the photodiode section 43. It is also connected to the negative terminal of a DC bias voltage source 44 for turning off the GTO thyristor. The electrode 34 which functions as the drain of the MOS transistor section 42 is connected to the positive terminal of the DC bias voltage source 44.

To turn on the GTO thyristor shown in FIG. 2, an optical signal is applied to the exposed surface of the junction between the N+ type region 26 and P type region 24 of the auxiliary GTO thyristor section 41. To turn off the GTO thyristor, an optical signal of hv (h: Planck's constant; v: frequency of a light wave) is applied to the exposed surface of the junction between the P type region 24 and any N+ type region 28 of the photodiode section 43.

As shown in FIG. 3, which is a plan view of the main GTO thyristor section 40, the electrode 32 which serves as the gate electrode of the MOS transistor section 42 is connected to other MOS transistor sections arranged around the section 40. The drain electrode 34 of the MOS transistor section 42 is connected to other MOS transistor sections.

Figure 4:
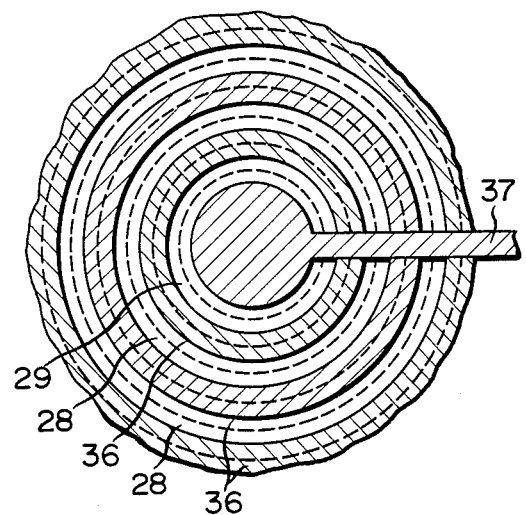

FIG. 4 is a plan view of the photodiode section 43. As this figure shows, the N+ type regions 28 are ring-shaped and concentrically arranged, thus surrounding the electrode 37 (i.e., the anode) formed on the surface of the P− type region 29. The electrodes 36 are also ring-shaped and concentrially arranged, thus surrounding the electrode 37.

Figure 5:
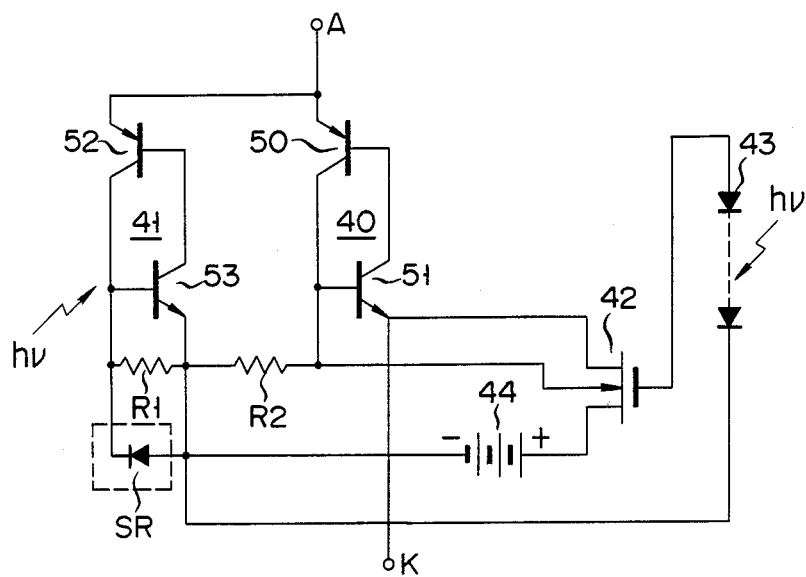
FIG. 5 is an equivalent circuit diagram of the GTO thyristor shown in FIG. 2.

FIG. 5 is the equivalent circuit diagram of the GTO thyristor. As this figure shows, the main GTO thyristor section 40 comprises a PNP transistor 50 and an NPN transistor 51. The emitter of the transistor 50 is coupled to an anode A, and the emitter of the transistor 51 is coupled to a cathode K. The collector and base of the transistor 50 are connected to the base and collector of the transistor 51, respectively.

As shown in FIG. 5, the auxiliary GTO thyristor section 41 comprises a PNP transistor 52 and an NPN transistor 53. The emitter of the transistor 52 is coupled to the anode A. The base and emitter of the transistor 53 are coupled by a resistor R1. The emitter of this transistor 53 is connected by a resistor R2 to the base of the NPN transistor 51 of the main GTO thyristor section 40. The collector and base of the PNP transistor 52 are connected to the base and collector of the NPN transistor 53, respectively. The emitter of the transistor 51 is coupled to the source of the MOS transistor section 42. The drain of the section 42 is connected to the positive terminal of the DC bias voltage source 44.

The negative terminal of the voltage source 44 is connected to the emitter of the NPN transistor 53. The anode of the photodiode section 43 is connected to the gate of the MOS transistor section 42. The cathode of the section 43 is connected to the emitter of the NPN transistor 53. The registors R1 and R2 shown in FIG. 5 correspond to the resistance components existing in the P type region 24 (FIG. 2).

With reference to FIG. 5, the operation of the GTO thyristor of FIG. 2 will be explained. A voltage is applied between the anode A and cathode K, thus placing the anode A and cathode K at positive and negative potentials, respectively. Hence, the anode-cathode path is cut off. Suppose an optical signal (hv) is applied to the exposed base-emitter junction of the NPN transistor 53 of the auxiliary GTO thyristor section 41. Electron-hole pairs are formed in the depletion layer of this base-emitter junction. The electrons move to the N+ type emitter region, and the holes move to the P type base region, due to the built-in voltage of the junction. When the potential difference caused by these movements of electrons and holes increases to a value substantially equal to the diffusion potential difference, a current starts flowing through the baseemitter junction of the NPN transistor 53. When this current flows into the base of the PNP transistor 52, the auxiliary GTO thyristor section 41 is turned on. The cathode current of this section 41 flows into the gate of the main GTO thyristor 40 via the resistor R2, thereby turning on the main GTO thyristor section 40. Hence, a large current flows between the anode A and the cathode K.

To turn off the GTO thyristor, an optical signal of hν is applied to the photodiode section 43. The section 43 has about ten photodiodes connected in series. When the section 43 is illuminated, a voltage is generated between the anode and cathode of each photodiode. The gate electrode of the MOS transistor section 42 is thus set at a positive potential, i.e., a potential higher than that of a back gate. Ten photodiodes can serve to apply a gate voltage to the MOS transistor section 42, which is higher than the threshold voltage Vth of the section 42. Therefore, the output voltage of the section 43 turns on the MOS transistor section 42. As a result, a DC current flows via a loop consisting of the DC bias voltage source 44, the drain and source of the MOS transistor section 42, the emitter and base of the NPN transistor 51, and the resistor R2. This current cancels out the excessive carriers in the P base, which serves as the collector of the PNP transistor 50 and also as the base of the NPN transistor 51. When these carriers are cancelled out, the base-emitter junction of the NPN transistor 51 of the main GTO thyristor section 40 is reversely biased. Consequently, no current flows through the base of the PNP transistor 50, whereby the main GTO thyristor section 40 is turned off.

Since the GTO thyristor can be turned on and off by optical signals in the manner described above, its control circuit can be electrically separated from the main circuit. This allows for a miniaturized GTO thyristor system, reduced cost and an enhanced reliability.

As stated earlier, the N+ type region 25, which is used as the N+ emitter of the main GTO thyristor section 40, is also used as the source of the MOS transistor section 42. Hence, the equivalent circuit of FIG. 5 can be formed on the same substrate. This makes it easy to fabricate the GTO thyristor device, raises the reliability of the device, reduces the electrical capacitance of the device, and minimizes the required chip area.

As shown in FIG. 5, a diode SR may be connected between the ends of the register R1 of the auxiliary GTO thyristor section 41. The section 41 has the transistors 52 and 53 which form a so-called "amplifying gate." The diode SR turns off this amplifying gate more reliably.

Figure 6:
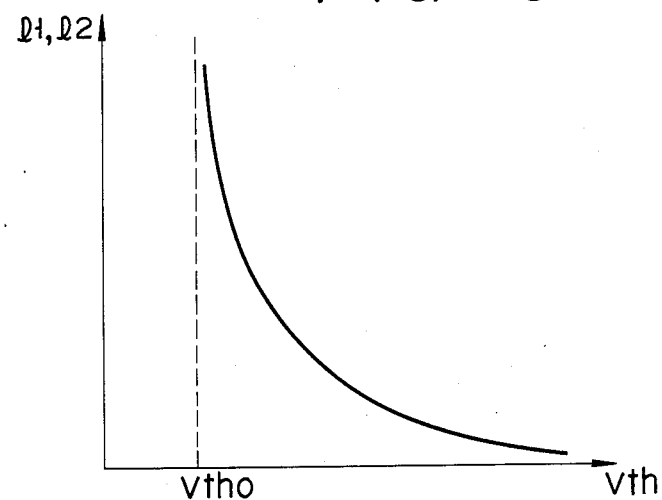
FIG. 6 is a graph showing the characteristic of the GTO thyristor shown in FIG. 2.

As mentioned above, expressions (1) and (2) must be satisfied to form the N+ regions 25, 27 and 26. This is because the threshold voltage Vth of the MOS transistor section 42 must be prevented from rising as the number of holes per unit volume increases. The voltage Vth has the relationship shown in FIG. 6 with the distances $l_1$ and $l_2$, on the other, have the relationship. In FIG. 6, Vth0 is the threshold voltage which the MOS transistor section 42 has when no current flows through the GTO thyristor.

In the embodiment of FIGS. 1 to 3, the P− type region 29 formed on the exposed portion of the P type region 24 lowers the threshold voltage of the MOS transistor section 42, thereby reducing the number of necessary photodiodes of the photodiode section 43 to a minimum. Hence, the region 29 may be formed on only that portion of the region 24 which is a part of the MOS transistor section 42.

Figure 7:
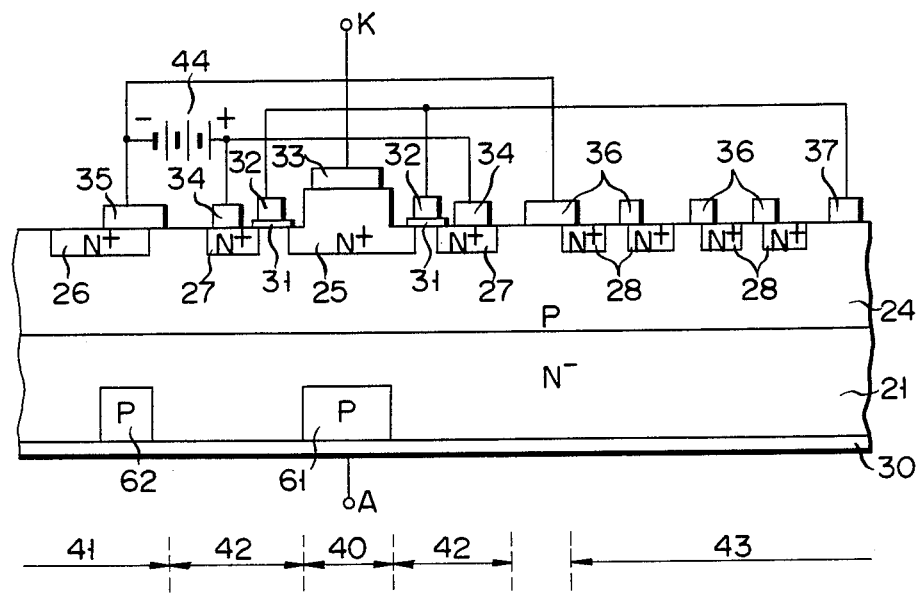
FIGS. 7 and 8 are cross-sectional views of two other GTO thyristors according to the invention.

The embodiment described above is the so-called planar type. Nonetheless, the present invention is not limited to this type. FIG. 7 is a cross-sectional view of another GTO thyristor of the invention which is a mesa type device. This GTO thyristor comprises an N− type region 21, a P type region 24, a P type region 61 which is formed by impurity diffusion in the region 21, and a P type region 62 formed by impurity diffusion in the region 21. The region 21 functions as an N− base. The regions 61 and 62 function as the P emitter of a main GTO thyristor section 40 and the emitter of an auxiliary GTO thyristor section 41, respectively. N+ type regions 25, 26, 27 and 28 are formed in the region 24 by selectively diffusing an N type impurity into the exposed surface region of the P type region 24. That portion of the region 24 which includes the N+ type regions 26, 27 and 28 is etched to the depth of 10 μm, whereby the region 25, i.e., the N+ emitter of the main thyristor section 40, protrudes. The GTO thyristor of FIG. 7 comprises other elements which are the same as those shown in FIG. 2 and which are thus designated by the same numerals as used in in FIG. 2.

The embodiment of FIG. 7 is advantageous in that, since a cathode can be press-bonded to the protruding N+ emitter of the main thyristor section 40, the GTO thyristor may have a great electrical capacity. Moreover, the impurity concentration of the channel region of the MOS transistor section 42 is lowered since the upper surface portion of the region 24, which has a high impurity concentration, has been removed by said etching process. Accordingly, the threshold voltage Vth of the MOS transistor section 42 can be sufficiently low without forming a P− type region as in the planar type GTO thyristor of FIG. 2.

Figure 8:
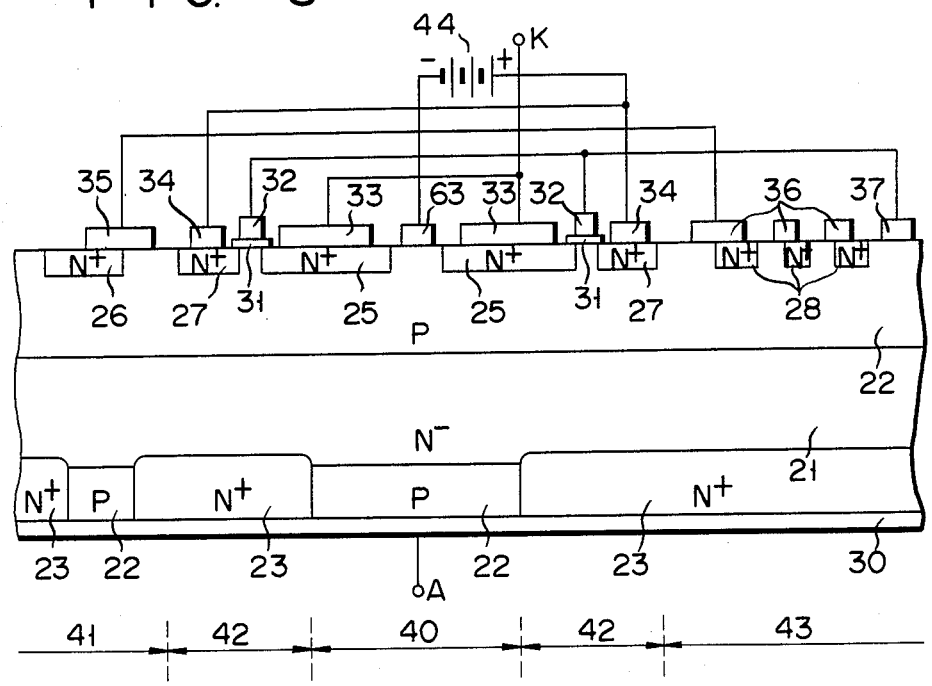

FIG. 8 is a plan view of another embodiment of the invention, i.e., a planar type GTO thyristor with a gate provided in the center portion. This GTO thyristor has a ring-shaped N+ type region 25 which is a part of a main GTO thyristor section 40. A gate electrode 63 is provided. This electrode 63 is surrounded by the N+ type region 25 and is connected to the negative terminal of a DC bias voltage source 44 for turning off the GTO thyristor. All the elements of the embodiment shown in FIG. 8, other than this gate electrode 63, are the same as those shown in FIG. 2.

Figure 9:
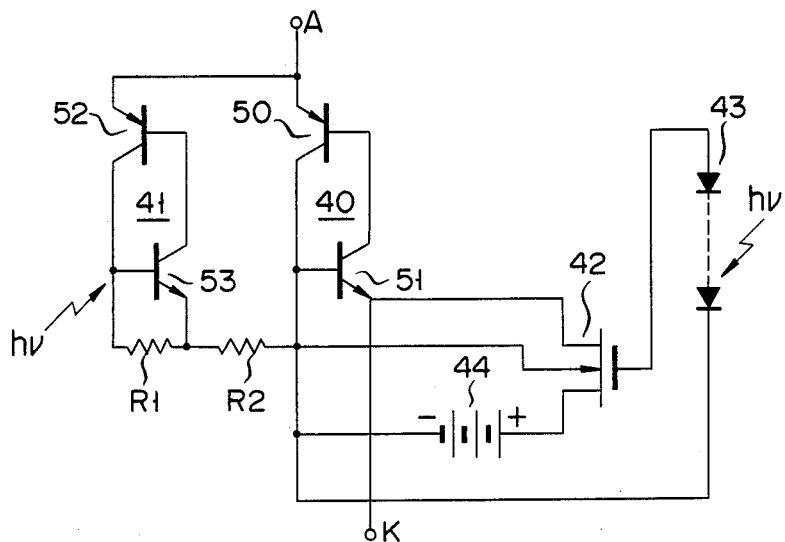
FIG. 9 is an equivalent circuit diagram of the GTO thyristor shown in FIG. 8.

FIG. 9 is an equivalent circuit diagram of the GTO thyristor shown in FIG. 8. As this figure illustrates, the negative terminal of the voltage soruce 44 and the cathode of the photodiode section 43 are directly coupled to the base of the transistor 51 of the main GTO thyristor section 40, not using the register R2 (FIG. 5). Therefore, the reverse current, which flows through the base-emitter junction of the NPN transistor 51 when the GTO thyristor is turned off, does not flow through any resistor, and excessive carriers can be cancelled out very quickly. As a result, the GTO thyristor can be turned more quickly than the GTO thyristor of FIG. 2.

Figure 10:
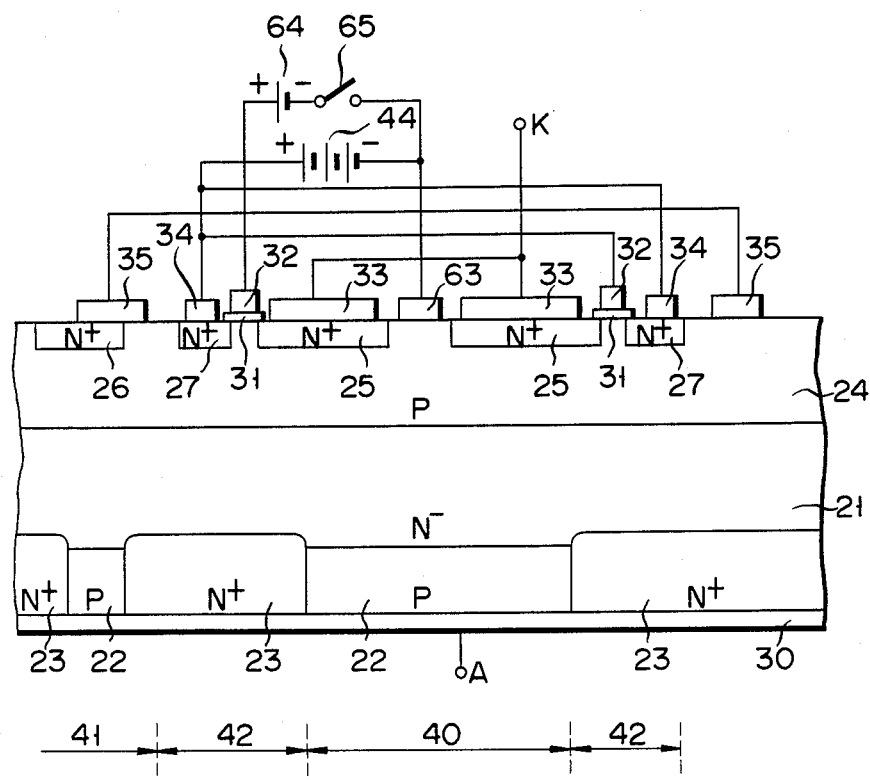
FIG. 10 is a cross-sectional view of still another GTO thyristor according to the present invention.

To turn off any GTO thyristor described above, an optical signal is applied to the photodiode section 43. Alternatively, the GTO thyristor may be turned off by an external DC bias voltage source. If this is the case, the photodiode section 43 can, of course, be omitted. FIG. 10 is a cross-sectional view of another GTO thyristor of this invention, which is turned off by an external bias voltage source and which has no photodiode section. In other words, this embodiment is identical with the GTO thyristor of FIG. 8, except that it has no photodiode section and that a DC bias voltage source 64 and a switch 65 are connected in series between a gate electrode 63 and the gate electrode of a MOS transistor section 42.

The GTO thyristor of FIG. 10 is turned off when the switch 65 is closed. More specifically, when the switch 65 is closed, the gate of the MOS transistor section 42 is set at a positive potential by the DC bias voltage source 64. The section 42 is therefore turned on, and the main GTO thyristor section 40 is turned off. In this case, the auxiliary GTO thyristor section 41 works as an amplifying gate. This gate is very sensitive to a voltage pulse, i.e., a gate signal, from the external DC bias voltage source 64. The source 64 and the switch 65 may be replaced by a logic circuit. The low-level output of a logic circuit can control the large current in the GTO thyristor of FIG. 10.

This invention is not limited to GTO thyristors. It may be applied to a transistor which is made by replacing the P type region 22 (FIG. 2) or the P type region 61 (FIG. 7) with an N+ collection region.

What is claimed is:

1. A semiconductor device which is turned on and off by first and second optical signals, respectively, comprising:
   a main GTO thyristor section which is turned on or off by a gate signal supplied to a gate terminal in accordance with the direction in which a current corresponding to the gate signal flows;
   an auxiliary GTO thyristor section, connected between the anode and gate of said main GTO thyristor section, for turning on said main GTO thyristor section in response to the first optical signal; and
   a MOS transistor section, connected between the cathode and gate of said main GTO thyristor, for turning off said main GTO thyristor section in response to the second optical signal.

2. A semiconductor device which is turned on and off by first and second optical signals, respectively, comprising:
   a first semiconductor region of a first conductivity type;
   a second semiconductor region formed on one major surface of said first semiconductor region;
   a third semiconductor region formed on the other major surface of said first semiconductor region;
   a fourth semiconductor region of the first conductivity type formed on the exposed surface of said third semiconductor region;
   a fifth semiconductor region of the first conductivity type formed on the exposed surface of said third semiconductor region and electrically isolated from said fourth semiconductor region;
   an insulation film formed on at least that portion of said third semiconductor region which is positioned between said fourth and fifth semiconductor regions;
   a first electrode formed on said fourth semiconductor region;
   a second electrode formed on said third semiconductor region;
   a third electrode formed on said fifth semiconductor region;
   a fourth electrode formed on said insulation film; and
   connecting means electrically connecting said second electrode and third electrode,
   wherein said first, second, third and fourth semiconductor regions form a switching element which is turned on in response to said first optical signal and turned off in response to said second optical signal, and said fourth and fifth semiconductor regions are used as the source and drain of a MOS transistor, respectively.

3. A semiconductor device according to claim 2, wherein said second semiconductor region comprises the second conductivity type, and said switching element is a GTO thyristor.

4. A semiconductor device according to claim 2, wherein said second semiconductor region comprises the first conductivity type, and said switching element is a transistor.

5. A semiconductor device according to claim 2, wherein said connecting means includes a power source for applying a DC bias voltage.

6. A semiconductor device according to claim 2, wherein said switching element is turned off when a predetermined DC bias voltage is applied between said second electrode and said fourth electrode.

7. A semiconductor device according to claim 2, wherein at least that portion of said third semiconductor region which is positioned between said fourth and fifth semiconductor regions has a surface and an interior region, said surface having a lower impurity concentration than the interior region.

8. A semiconductor device according to claim 2, wherein the DC bias voltage applied between said second electrode and said fourth electrode is applied by a photodiode.

9. A semiconductor device according to claim 2, wherein said photodiode comprises said third semiconductor region and a plurality of sixth semiconductor regions of the first conductivity type formed on said third semiconductor region.

10. A semiconductor device formed on a single substrate, which is turned on or off in accordance with the direction in which a current corresponding to a gate signal flows in response to first and second optical signals, respectively, comprising:
    a main circuit including a main GTO thyristor section;
    an auxiliary GTO thyristor section connected between the anode and gate of said main GTO thyristor section to supply an igniting signal to said main GTO thyristor section in response to said first optical signal; and
    a MOS transistor section connected between the cathode and gate of said main GTO thyristor to supply an extinguishing signal to said main GTO thyristor section in response to said second optical signal.

11. A semiconductor device according to claim 10, wherein the N emitter region of said main GTO thyristor section also functions as the source of said MOS transistor section.

* * * * *